(12) United States Patent
Asakawa

(10) Patent No.: US 6,500,759 B1
(45) Date of Patent: Dec. 31, 2002

(54) PROTECTIVE LAYER HAVING COMPRESSION STRESS ON TITANIUM LAYER IN METHOD OF MAKING A SEMICONDUCTOR DEVICE

(75) Inventor: Tsutomu Asakawa, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/554,906

(22) PCT Filed: Oct. 5, 1999

(86) PCT No.: PCT/JP99/05470

§ 371 (c)(1),
(2), (4) Date: Aug. 8, 2000

(87) PCT Pub. No.: WO00/21121

PCT Pub. Date: Apr. 13, 2000

(30) Foreign Application Priority Data

Oct. 5, 1998 (JP) ............................................ 10-283014

(51) Int. Cl.[7] .............................................. H01L 21/44
(52) U.S. Cl. ...................... 438/683; 438/664; 438/938; 257/770; 257/785
(58) Field of Search .................................. 438/664, 682, 438/683, 902, FOR 487, 938, FOR 360; 148/DIG. 15; 257/754, 757, 763–4, 768, 770, 785, 742

(56) References Cited

U.S. PATENT DOCUMENTS 4,690,730 A 9/1987 Tang et al.
5,811,335 A * 9/1998 Santangelo et al.
5,874,342 A * 2/1999 Tsai et al. .................... 257/384
6,184,115 B1 * 2/2001 Kou et al. ................... 438/586

FOREIGN PATENT DOCUMENTS

| EP | 0 908 935 A2 | 4/1999 |
| JP | 03-014234 * | 1/1991 |
| JP | A-7-201777 | 8/1995 |
| JP | A-10-125623 | 5/1998 |
| JP | A-10-144919 | 5/1998 |
| JP | A-11-121399 | 4/1999 |

* cited by examiner

Primary Examiner—Long Pham
Assistant Examiner—Thanh V Pham
(74) Attorney, Agent, or Firm—Oliff & Berridge, PLC

(57) ABSTRACT

The method of manufacturing a semiconductor device of the present invention comprises a step of forming a titanium layer (2) on silicon-containing layers (a gate electrode (14) and an impurity layer (18)) which are formed on a silicon substrate (1); a step of forming a protective layer (3) having compression stress on the silicon substrate (1), on the titanium layer (2); and a step of forming a titanium silicide layer by reacting silicon in the silicon containing layer and titanium in the titanium layer (2) by thermal processing. The compression stress of the protective layer is preferably in the range from $1\times10^9$ Dyne/cm$^2$ to $2\times10^{10}$ Dyne/cm$^2$. The protective layer (3) is preferably made from at least one metal selected from the group consisting of tungsten, cobalt, tantalum, and molybdenum. According to the present invention, a fine interconnecting effect is suppressed by avoiding the effect of a stress which obstructs a phase transition in the titanium silicide layer.

12 Claims, 7 Drawing Sheets

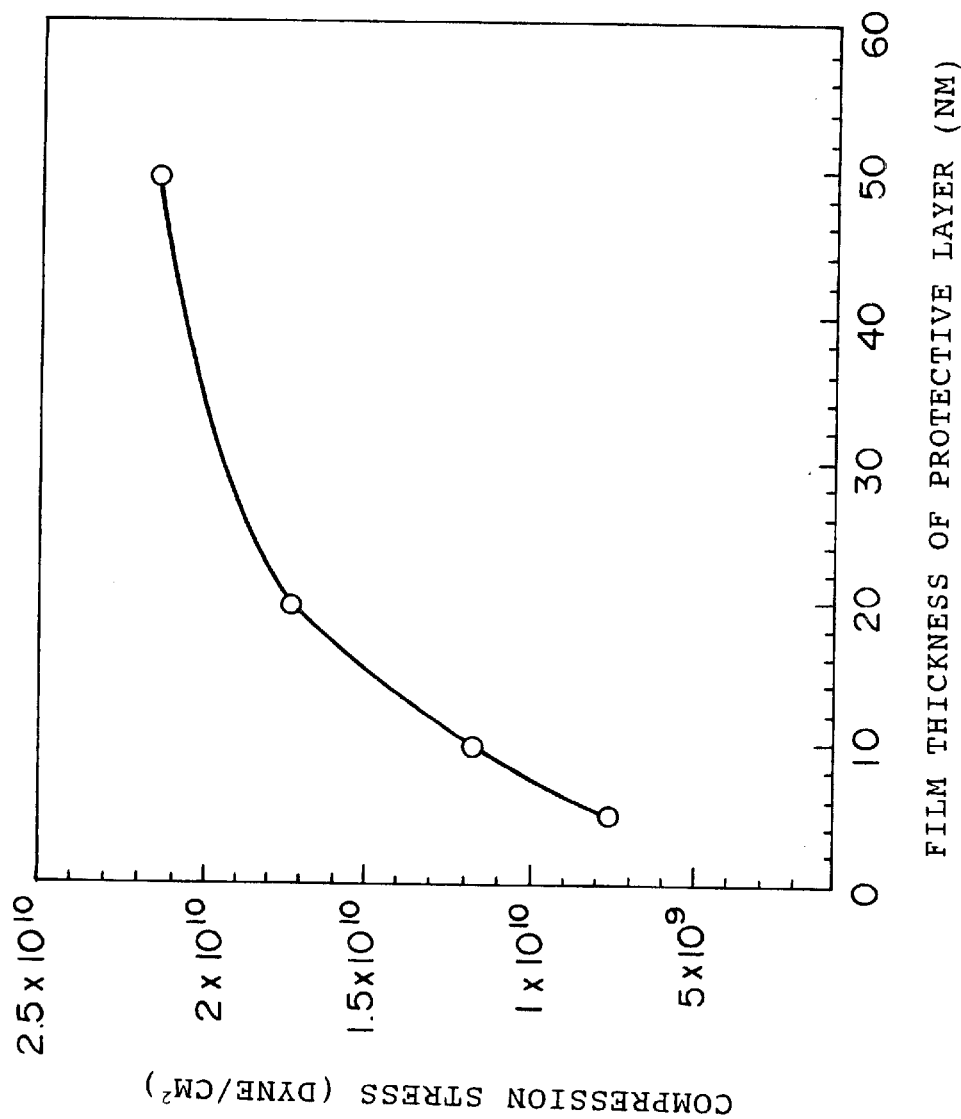

PROTECTIVE LAYER HAVING COMPRESSION STRESS ON TITANIUM LAYER IN METHOD OF MAKING A SEMICONDUCTOR DEVICE

TECHNICAL FIELD

The present invention relates to a semiconductor device including a titanium silicide layer and a method of manufacturing the same. In particular, the present invention relates to a semiconductor device in which a fine interconnecting effect is suppressed by avoiding the effect by stress in a titanium silicide layer, and to a method of manufacturing the semiconductor device.

BACKGROUND OF THE INVENTION

Salicide (self aligned silicide) technology is known as a means for speeding-up and high integration of semiconductor devices. This technology is typified by self-adjustably forming metal silicide layers 26a and 26b on, for example, silicon-containing layers comprising a gate electrode 22 and an impurity region 24 formed on a silicon substrate 20, in an MOS type semiconductor device, as shown in FIG. 10. Suppressing the resistance of the metal silicide layers 26a and 26b is desirable for increasing the speed of the circuit.

However, a problem called a fine interconnecting effect is known to occur when the width of the interconnecting is reduced. The following problems occur in the technology utilizing a titanium silicide layer. Specifically, decreasing the width of the gate electrode and impurity region to increase the degree of integration results in an increase in both the fluctuation of resistance and the average resistance value in titanium silicide layers.

The reason for the fine interconnecting effect is considered to be as follows. There are two types in titanium silicide. One has a high resistance (about 100 Ω·cm) crystal structure (called "C49 structure"), and the other has a low resistance (about 15Ω·cm) crystal structure (called "C54 structure"). The high resistance crystal structure (C49 structure) is formed at a temperature of about 400° C. to 600° C., whereas the low resistance crystal structure (C54 structure) is formed at a higher temperature of about 700° C. to 800° C. However, as the interconnectings become fine, a phase transition from the high resistance crystal structure to the low resistance crystal structure is obstructed, resulting in a higher ratio of the high resistance crystal structure. In addition, fluctuation in the ratio of the low resistance crystal to the high resistance crystal increases as the interconnecting becomes minute. For these reasons, when the interconnecting width of the gate electrode and the like is less than a certain level, for example, less than about 0.35 $\mu$m, the problems of fluctuation in the resistance of titanium silicide layers and an increase in the average value of the resistance become conspicuous.

DISCLOSURE OF INVENTION

An object of the present invention is to provide a semiconductor device in which a fine interconnecting effect is suppressed by avoiding the effect of stress in a titanium silicide layer, and a method of manufacturing the semiconductor device.

A method of manufacturing a semiconductor device of the present invention comprises:

a step of forming a titanium layer on a region which contains a conductive silicon-containing layer;

a step of forming a protective layer having compression stress on the titanium layer; and a step of forming a titanium silicide layer by reacting silicon in the silicon-containing layer and titanium in the titanium layer by thermal processing.

In this method of manufacturing a semiconductor device, the titanium silicide layer is formed between the silicon-containing layer and the titanium layer by thermal processing on condition that the tensile stress in the titanium layer is weakened by the compression stress of the protective layer. Specifically, it is possible to suppress generation of stress which obstructs a phase transition in the titanium silicide layer by the protective layer having compression stress. This method ensures to obtain titanium silicide in which the phase transition from the high resistance crystal structure (C49 structure) to the low resistance crystal structure (C54 structure) easily occurs.

As a result, the fine interconnecting effect can be suppressed making it possible to obtain a semiconductor device having low resistance and exhibiting only a small fluctuation in the resistance of titanium silicide layers, even if the interconnecting width of a gate electrode and the like is less than a certain level, for example, equal to or less than 0.35 $\mu$m.

In the present invention, the protective layer is formed from a layer having compression stress as a film stress at least under the condition that the protective layer is connected to a silicon substrate in which the silicon-containing layer is formed.

Taking sheet resistance of the titanium silicide layer and the like into consideration, the protective layer may have a compression stress in a range from $1 \times 10^9$ Dyne/cm$^2$ to $2 \times 10^{10}$ Dyne/cm$^2$, and more preferably from $7 \times 10^9$ Dyne/cm$^2$ to $2 \times 10^{10}$ Dyne/cm$^2$.

In addition, the protective layer may not contain oxygen or may have characteristics which do not allow oxygen to permeate. Because oxygen reacts with titanium and prevents the titanium from becoming the silicide.

For the above reasons, the protective layer may be made from at least one metal selected from tungsten, cobalt, tantalum, and molybdenum.

Examples of the thickness of each layer of the present invention are as follows. The thickness of each layer is appropriately determined according to design criteria and the like. In particular, the thickness of the protective layer is determined taking into account such factors as capability of securing smooth phase transition from the C49 structure to the C54 structure in the titanium silicide layer, and of obtaining a conductive layer which exhibits a small sheet resistance and small fluctuation in the sheet resistance.

The titanium layer may have a thickness of 10 nm to 50 nm.

The protective layer may have a thickness of 1 nm to 40 nm, and preferably 5 nm to 20 nm.

The silicon-containing layer may be at least one of a gate electrode including polycrystalline silicon formed on the silicon substrate and an impurity layer formed on the silicon substrate.

The method of manufacturing a semiconductor device of the present invention comprises following steps (a) to (f):

(a) a step of forming an isolation dielectric layer and a gate insulating layer on a silicon substrate, and forming a gate electrode containing silicon as a main component on the gate insulating layer;

(b) a step of forming a side spacer formed of an insulating layer on a side of the gate electrode;

(c) a step of forming an impurity layer which functions as at least one of a source and a drain by introducing an impurity in the silicon substrate;

(d) a step of forming a titanium layer entirely;

(e) a step of forming a protective layer having compression stress on the titanium layer; and (f) a step of forming a titanium silicide layer by reacting silicon in the silicon-containing layer and titanium in the titanium layer by thermal processing.

The step (f) may comprise:

a first thermal processing of forming a titanium silicide layer by converting the titanium layer into silicide; and a second thermal processing for effecting a phase transition of the titanium silicide layer.

The semiconductor device of the present invention may be obtained by the above-described method. Specifically, the semiconductor device comprises:

a silicon substrate;

a silicon-containing layer having conductivity; and a silicide layer containing titanium silicide as a main component formed on the silicon-containing layer, wherein the silicide layer is formed by forming a titanium layer on the silicon-containing layer, forming a protective layer having compression stress on the titanium layer, and converting titanium layer into silicide by thermal processing.

Preferably, the silicon-containing layer has a width of 0.35 μm or less, and the silicide layer has a sheet resistance of 5 Ω/cm² or less.

BRIEF DESCRIPTION OF DRAWINGS

FIG. 2 is a graph showing the relationship between the film thickness of a protective layer made of tungsten and the compression stress.

BEST MODE FOR CARRYING OUT THE INVENTION

Figure 1A:
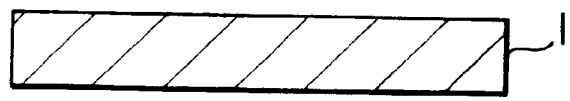
FIGS. 1A to 1D are sectional views conceptually showing a method of manufacturing a semiconductor device according to the present invention.

The present invention will be described in detail referring to the drawings.

Firstly, the present invention will be conceptually described.

FIGS. 1A to 1D are sectional views conceptually showing a method of manufacturing a semiconductor device according to the present invention. For ease of explanation, these figures are depicted so that the features of the present invention are highlighted, and are thus not necessarily precise descriptions of the matter.

FIG. 1A shows a silicon substrate 1. In the FIG. 1A, a wafer or part of the wafer is shown as a silicon substrate 1.

Figure 1B:
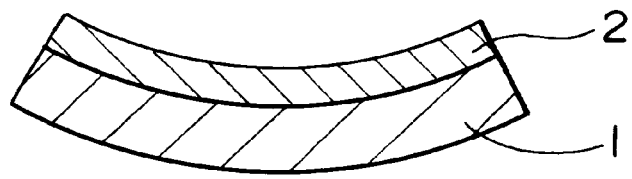

FIG. 1B shows a silicon substrate 1 on which a titanium layer 2 for a titanium silicide layer formed. The titanium layer 2 has a thickness of 10 nm to 50 nm, for example. When the titanium layer 2 is formed on the silicon substrate 1, the silicon substrate 1 bends to form a concavity-like configuration. In this state, tensile stress is occurred in the titanium layer 2.

Figure 1C:
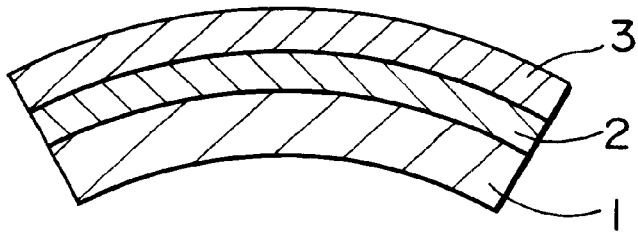

FIG. 1C shows a protective layer 3 formed on the titanium layer 2. The protective layer 3 is made from a layer having compression stress as a film stress. In this state, the silicon substrate 1, titanium layer 2, and protective layer 3 either become warped to form a convex-like configuration as shown in the drawing, or are flat (not shown in the drawing). A metal such as tungsten, cobalt, tantalum, or molybdenum is preferably used as a material for forming the protective layer 3, with tungsten or cobalt being particularly preferred.

Figure 1D:
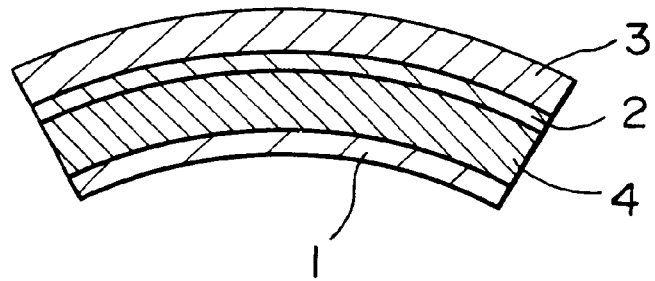

FIG. 1D shows a state after a titanium silicide layer 4 has been formed by reacting silicon of the silicon substrate 1 and titanium of the titanium layer 2.

In the present invention, the titanium silicide layer 4 is formed between the silicon substrate 1 and the titanium layer 2 by thermal processing under the condition that the tensile stress in the titanium layer 2 is weakened by the compression stress of the protective layer 3. The protective layer 3 having compression stress can thus effectively suppress creation of a stress in the titanium silicide layer 4 which obstructs a phase transition. Titanium silicide in which the phase transition from the high resistance crystal structure (C49 structure) to the low resistance crystal structure (C54 structure) easily occurs can be obtained in this manner. As a result, according to the present invention a conductive layer having excellent conductivity can be obtained which can suppress a fine interconnecting effect in a titanium silicide layer, exhibits only a small fluctuation in the resistance even if the interconnecting width of the titanium silicide layer 4 is equal to or less than about 0.35 μm, and exhibits a small average value of resistance.

The reason that a protective layer 3 which has compression stress can effect smooth phase transition from the C49 structure to C54 structure in the titanium silicide layer 4 is thought to be as follows. The phase transition from the C49 structure to the C54 structure accompanies a decrease in the crystal volume. Therefore, the phase transition from the C49 structure to the C54 structure occurs only with difficulty if there is tensile stress in the titanium silicide layer. In the present invention, the presence of the protective layer 3 which exerts a compression stress on the titanium layer 2 for the titanium silicide layer can weaken the tensile stress of the titanium silicide layer 4 due to the compression stress. As a result, the phase transition from the C49 structure to the C54 structure which accompanies a volume reduction can be effected certainly and easily as compared with the case in which no protective layer is provided.

Relationship between film thickness and stress of the protective layer

Next, the following test was carried out to examine dependency of the stress of the protective layer on the film thickness. The results are shown in FIG. 2. In FIG. 2, the film thickness of the protective layer is plotted along the horizontal axis and the compression stress is plotted along the vertical axis.

In the test, a titanium layer with a thickness of 20 nm was formed on the silicon substrate. Samples were prepared by forming tungsten protective layers with different thicknesses on this titanium layer. The compression stress of the protective layer for each sample was measured to determine the relationship between the thickness of the protective film and the compression stress.

The compression stress of the protective layer was determined by measuring the degree of bending of the wafer by laser according to a known method.

As can be seen from the results shown in FIG. 2, the thicker the protective layer, the larger the compression stress of the protective layer. The compression stress of the protective layer is seen to increase steeply when the thickness is 5 nm to 40 nm, particularly 5 nm to 30 nm, and more particularly 5 nm to 20 nm. Although the relationship between the film thickness and the compression stress of the protective layer varies according to the thickness of the silicon substrate, the thickness of the titanium layer, the temperature of the substrate during sputtering, and the like, the general tendency is as shown in FIG. 2.

Taking the sheet resistance of the titanium silicide layer and the like which are discussed later into consideration, the protective layer has a compression stress in the range from $1 \times 10^9$ Dyne/cm$^2$ to $2 \times 10^{10}$ Dyne/cm$^2$, and preferably from $7 \times 10^9$ Dyne/cm$^2$ to $2 \times 10^{10}$ Dyne/cm$^2$.

Embodiment

Figure 7:
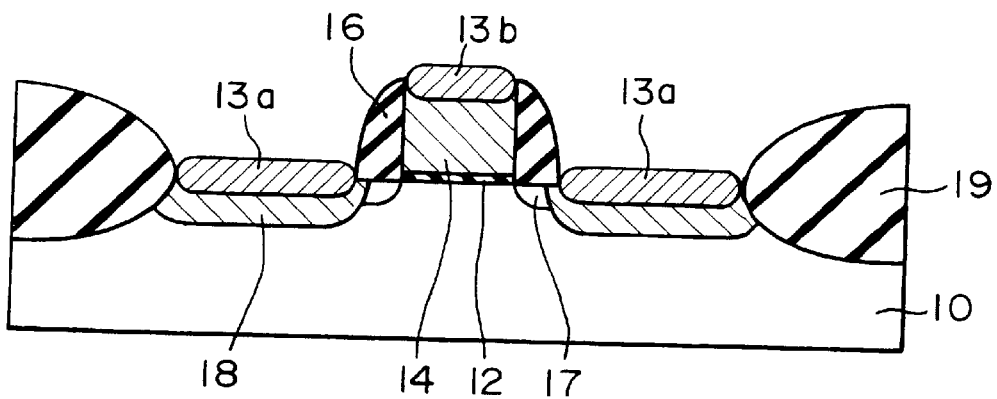
FIG. 7 a cross-sectional view schematically showing the method of manufacturing a semiconductor device according to the present invention, following the step shown in FIG. 6.
Figure 8:
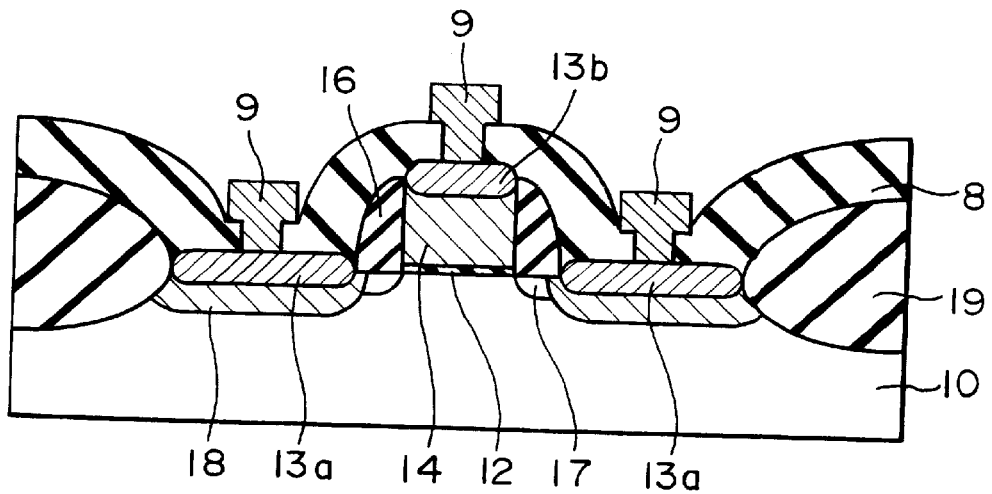
FIG. 8 a cross-sectional view schematically showing the method of manufacturing a semiconductor device according to the present invention, following the step shown in FIG. 7.

FIGS. 3 to 8 are cross-sectional views schematically showing a method of manufacturing the semiconductor device in accordance with an embodiment to which the present invention is applied. FIG. 8 shows a semiconductor device according to an embodiment of the present invention.

Figure 3:
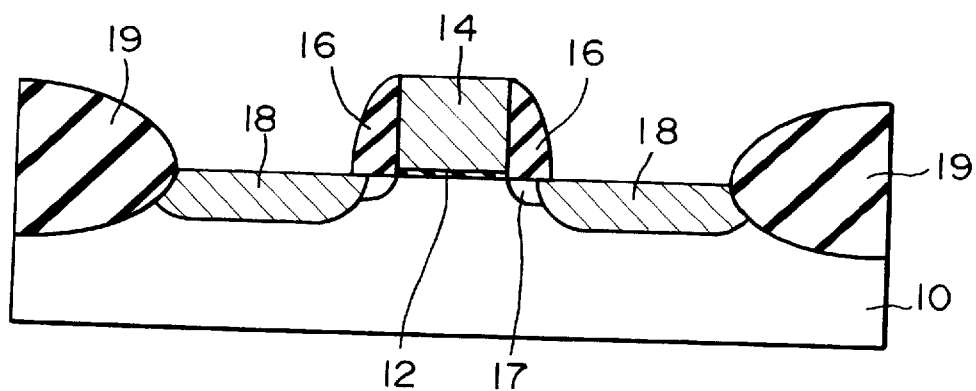
FIG. 3 is a cross-sectional view schematically showing the method of manufacturing a semiconductor device according to an embodiment of the present invention.

Fabrication method:

(a) As shown in FIG. 3, an element such as a MOSFET is formed on a silicon substrate 10 according to a known method. An example of manufacturing method of a MOSFET is described below. Isolation dielectric layers 19 are formed on the silicon substrate 10, and a gate insulating layer 12 is formed on the silicon substrate 10 in the area between the isolation dielectric layers 19. The isolation dielectric layers 19 are formed by a LOCOS (Local Oxidation Of Silicon) method, a Semi-recesses LOCOS method, a Shallow Trench method, or the like. A gate electrode 14 of doped polycrystalline silicon is formed on the gate insulating layer 12. A low concentration impurity layer 17 is formed by an ion injection method using the gate electrode 14 as a mask. Thereafter, a side spacer 16 formed of an insulating layer is formed on the side of the gate electrode 14. An impurity layer (source/drain) 18 is then self-adjustably formed on the silicon substrate 10 using the gate electrode 14 and the side spacer 16 as masks. The MOSFET formed according to this process is not limited to that shown in the FIG. 3, but may take any known structure. For example, the MOSFET may not have the low concentration impurity layer 17.

Figure 4:
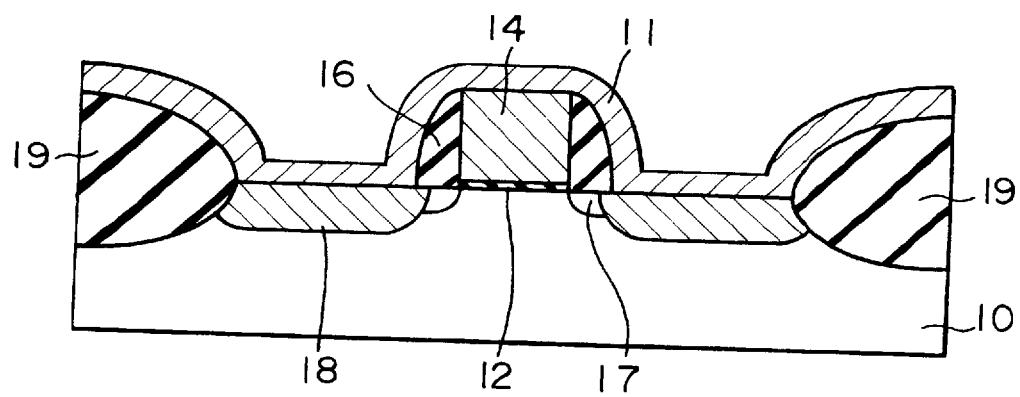
FIG. 4 a cross-sectional view schematically showing the method of manufacturing a semiconductor device according to the present invention, following the step shown in FIG. 3.
Figure 5:
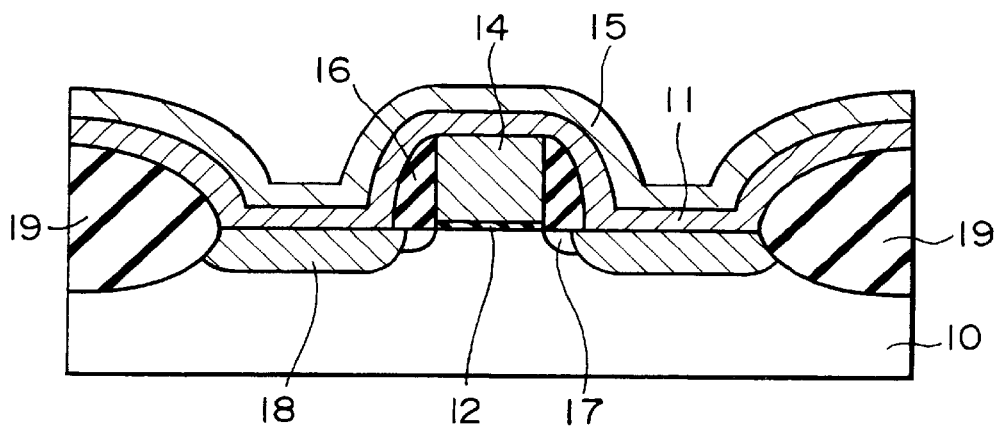
FIG. 5 a cross-sectional view schematically showing the method of manufacturing a semiconductor device according to the present invention, following the step shown in FIG. 4.
Figure 6:
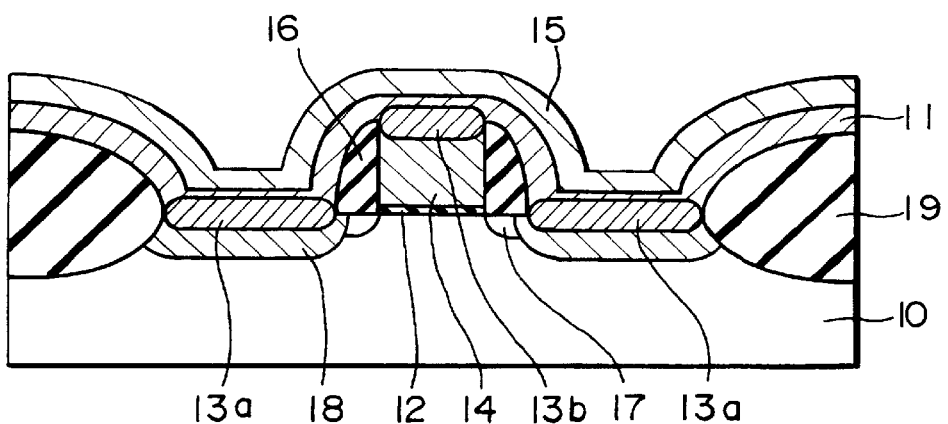
FIG. 6 a cross-sectional view schematically showing the method of manufacturing a semiconductor device according to the present invention, following the step shown in FIG. 5.

(b) Next, titanium is sputtered on the entire surface of the substrate including the gate electrode 14, side spacer 16, impurity layer 18, and isolation dielectric layer 19 to form a metal layer (titanium layer) 11 for the silicide as shown in FIG. 4. In this instance, the thickness of the metal layer 11 is about 10 nm to 50 nm, for example. The thickness of the metal layer 11 can be calculated by dividing a desired thickness of the titanium silicide layer by a certain fixed value. The fixed value is about 2.5 in this embodiment. Sputtering in this step is preferably carried out by heating the silicon substrate at about 400° C.

(c) Then, a protective layer 15 is formed on the metal layer 11 by sputtering a metal which has compression stress such as tungsten, on the silicon substrate 10. In this instance, the thickness of the protective layer 15 should be determined taking into consideration securing a sufficient compression stress for mitigating the tensile stress of the metal layer 11 for the silicide layer, for example, 1 nm to 40 nm. Here, mitigating the tensile stress of the metal layer 11 includes decreasing the tensile stress of the metal layer 11, reducing the film stress of the metal layer 11 to almost zero, and converting the tensile stress of the metal layer 11 into compression stress.

Sputtering in this step is preferably carried out continuously followed by the sputtering of the metal layer 11. Specifically, the protective layer 15 is sputtered by heating the silicon substrate at about 400° C. on condition that the wafer is not exposed to open air.

(d) Next, the silicon substrate 10 on which the metal layer 11, protective layer 15, impurity layer 18, gate electrode 14, and the like have been formed is subjected to a first thermal processing under an atmosphere of nitrogen and the like. The first thermal processing is carried out for 30 to 60 seconds at 650° C. to 750° C., for example. In this first thermal processing, silicon in the impurity layer 18 and the gate electrode 14 reacts with titanium in the metal layer 11 to form titanium silicide layers 13a and 13b with a thickness of about 20 nm to 125 nm on the surfaces of the impurity layer 18 and the gate electrode 14.

(e) After that, the metal layer 11 and protective layer 15 which remain on the isolation dielectric layer 19 and the side spacer 16 without being converted into silicide are removed by etching, as shown in FIG. 7. An etching solution prepared by, for example, adding hydrogen peroxide to aqueous ammonia is used. Next, a second thermal processing is carried out in an atmosphere such as nitrogen. The second thermal processing is carried out for 30 to 60 seconds at 800° C. to 850° C., for example. A phase transition from the high resistance crystal structure (C49 structure) to the low resistance crystal structure (C54 structure) occurs in the titanium silicide layer 13 during the second thermal processing.

(f) Next, an upper interconnecting layer, an interlayer dielectric, a passivation layer, and the like are formed using a known technology, as shown in FIG. 8. For instance, an interlayer dielectric 8 of silicon oxide is formed on the titanium silicide layers 13a, 13b, the isolation dielectric layer 19, and the side spacer 16. Then, a contact hole is formed in the interlayer dielectric 8 at locations on the titanium silicide layers 13a, 13b, and an interconnecting layer 9 which is electrically connected to the titanium silicide layers 13a, 13b is formed in the contact hole. As the interconnecting layer, a conventionally known interconnecting layer, for example, an interconnecting layer formed by laminating layers of Ti/TiN/Al—Cu alloy/TiN from the substrate, can be used.

A semiconductor device according to this embodiment can be obtained according to the above process. This semiconductor device comprises a silicon substrate 10, silicon-containing layers having conductivity, i.e. a gate electrode 14 and an impurity layer 18, and titanium silicide layers 13b, 13a which are formed on the gate electrode 14 and the impurity layer 18 by the above-described steps (d) and (e). With this semiconductor device, the seat resistance for the titanium silicide layers 13a and 13b may be 5 $\Omega/cm^2$ or less, even if the width of the gate electrode 14 or the impurity layer 18 is equal to or less than 0.35 μm, as discussed later.

According to this embodiment, the tensile stress of the titanium silicide layer 13 can be mitigated by using a metal layer such as tungsten, cobalt, or the like which has a compressive force on the silicon substrate as a protective layer 15, when the titanium metal layer is converted into silicide. Specifically, when a metal layer 11 made of titanium is formed over the silicon substrate 10 which has a gate electrode 14 and an impurity layer 18, tensile stress occurs in the metal layer 11. Then, when a protective layer 15 is formed on the metal layer 11, compression stress occurs in the protective layer 15. This is clear from the results of measurement of the compression stress shown in FIG. 2.

Because the tensile stress of the titanium layer is offset by the compression stress of the protective layer, generation of stress which obstructs the phase transition of silicide in the titanium silicide can be suppressed. This ensures that the phase transition from the high resistance crystal structure (C49 structure) to the low resistance crystal structure (C54 structure) occurs more easily. It is therefore possible to suppress occurrence of the above-mentioned fine interconnecting effect, even if the width (gate length) of the interconnecting layer or the width of the impurity layer is small. As a result, the high speed and high integration of semiconductor device can be achieved.

Relationship between the sheet resistance and interconnecting width

Next, a test conducted to measure the relationship between the sheet resistance and interconnecting width of the semiconductor device according to the present invention will be discussed.

Figure 9:
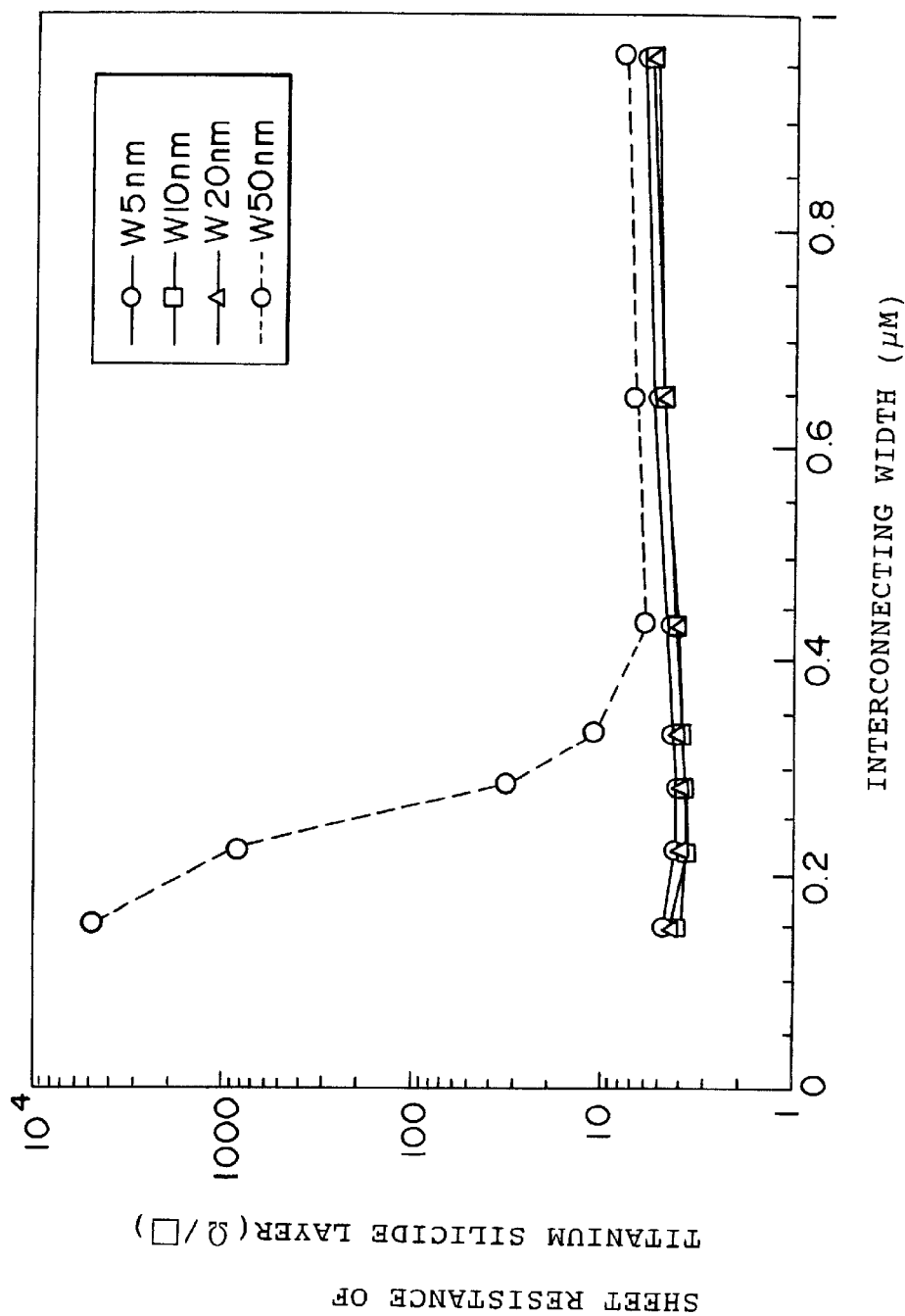
FIG. 9 is a graph showing the relationship between the interconnecting width and the sheet resistance of the titanium silicide layer formed according to the method of the present invention.
Figure 10:
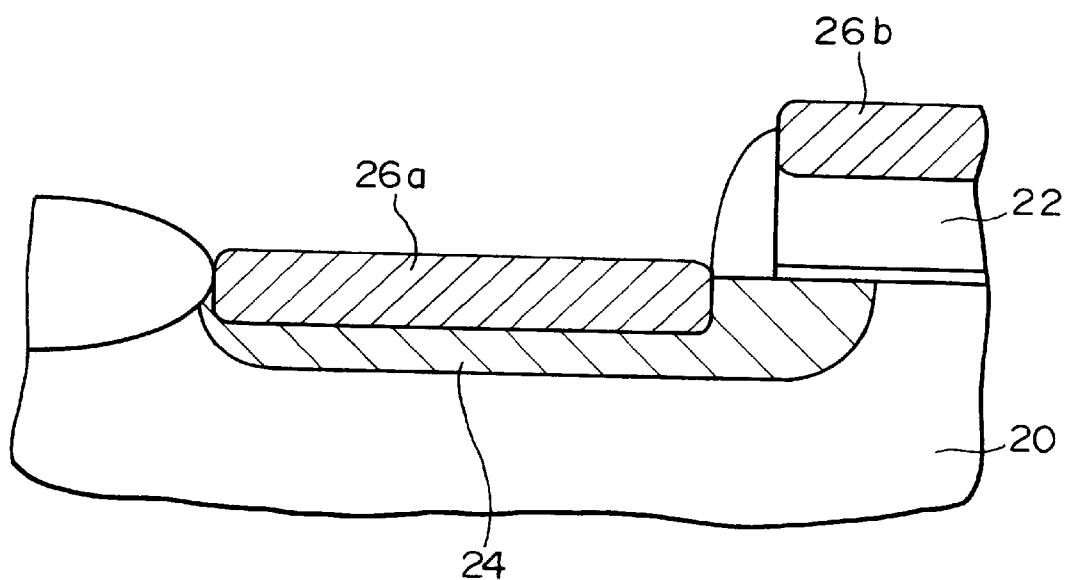
FIG. 10 a cross-sectional view showing part of a semiconductor device having a titanium silicide layer.

FIG. 9 is a graph showing the relationship between the width of the titanium silicide layer (called also "interconnecting width" which is approximately the same as the gate length) formed according to the above-described method of the present invention, and the sheet resistance of the interconnecting layer.

The samples used for the measurement were those having a polysilicon layer for the gate electrode 14 with a thickness of 0.2 μm and a titanium layer 11 with a thickness of 25 nm, and processed at 700° C. for 30 seconds (first thermal processing) and at 800° C. for 30 seconds (second thermal processing). Four types of tungsten protective layers with different film thicknesses were provided. For the measurement, seven samples with different interconnecting widths were used for each of the first to fourth types of titanium silicide layers.

First titanium silicide layer: 5 nm
Second titanium silicide layer: 10 nm
Third titanium silicide layer: 20 nm
Fourth titanium silicide layer: 50 nm As can be seen in FIG. 9, the fourth titanium silicide layer in which a tungsten layer with a thickness of 50 nm is used as a protective layer exhibited a steep rise in sheet resistance when the interconnecting width decreased to 0.35 μm or less. In contrast, the first to third titanium silicide layers in which tungsten layers with thicknesses of 20 nm, 10 nm, and 5 nm are respectively used as a protective layer exhibited sufficiently low sheet resistance in the range from 3 $\Omega/cm^2$ to 5 $\Omega/cm^2$, even if the interconnecting width is equal to or less than 0.35 μm, for example 0.15 μm.

As a result, the above-described effect of the present invention, that is, the effect of suppressing a fine interconnecting effect when decreasing the interconnecting width, has been confirmed. It has also been confirmed that the sample having a tungsten protective layer with a thickness of 50 nm could not suppress the fine interconnecting effect. This suggests that if the protective layer is too thick, the compression stress of the protective layer is so large that a reverse stress which may obstruct the phase transition will occur in the titanium silicide layer.

Based on the above results, and taking the sheet resistance of the interconnecting layer into consideration, the thickness of the tungsten protective layer is preferably 1 nm to 40 nm, and more preferably 5 nm to 20 nm. Moreover, it has been confirmed that a protective layer made of cobalt exhibits a similar effect to the tungsten protective layer.

The present invention is not limited to the embodiment described above. Many modifications and variations are possible without departing from the spirit and scope of the present invention.

What is claimed is:

1. A method of manufacturing a semiconductor device comprising:
    a step of forming a titanium layer on a region which contains a conductive silicon-containing layer;
    a step of forming a protective layer having compression stress on the titanium layer; and
    a step of forming a titanium silicide layer by reacting silicon in the silicon-containing layer and titanium in the titanium layer by thermal processing,
    wherein the protective layer is made from at least one metal selected from tungsten, cobalt, tantalum, and molybdenum.

2. The method of manufacturing a semiconductor device according to claim 1,
    wherein the compression stress is in a range from $1\times10^9$ Dyne/cm$^2$ to $2\times10^{10}$ Dyne/cm$^2$.

3. The method of manufacturing a semiconductor device according to claim 2,
    wherein the compression stress is in a range from $7\times10^9$ Dyne/cm$^2$ to $2\times10^{10}$ Dyne/cm$^2$.

4. The method of manufacturing a semiconductor device according to claim 1,
    wherein the titanium layer has a thickness of 10 nm to 50 nm.

5. The method of manufacturing a semiconductor device according to claim 1,
    wherein the protective layer has a thickness of 1 nm to 40 nm.

6. The method of manufacturing a semiconductor device according to claim 5,
    wherein the protective layer has a thickness of 5 nm to 20 nm.

7. The method of manufacturing a semiconductor device according to claim 1,
    wherein the silicon-containing layer is at least one of a gate electrode including polycrystalline silicon formed on the silicon substrate and an impurity layer formed on the silicon substrate.

8. A method of manufacturing a semiconductor device comprising the following steps (a) to (f):
    (a) a step of forming an isolation dielectric layer and a gate insulating layer on a silicon substrate, and forming a gate electrode containing silicon as a main component on the gate insulating layer;

(b) a step of forming a side spacer formed of an insulating layer on a side of the gate electrode;

(c) a step of forming an impurity layer which functions as at least one of a source and a drain by introducing an impurity in the silicon substrate;

(d) a step of forming a titanium layer entirely on the resulting structure;

(e) a step of forming a protective layer having compression stress on the titanium layer; and (f) a step of forming a titanium silicide layer by reacting silicon in at least one of the gate electrode layer and the impurity layer and titanium in the titanium layer by thermal processing, wherein the protective layer is made from at least one metal selected from tungsten, cobalt, tantalum, and molybdenum.

9. A method of manufacturing a semiconductor device according to claim 8, wherein the step (f) comprises:
- a first thermal processing of forming a titanium silicide layer by converting the titanium layer into silicide; and
- a second thermal processing for effecting a phase transition of the titanium silicide layer.

10. A semiconductor device comprising:

a silicon substrate;

a silicon-containing layer having conductivity; and a silicide layer containing titanium silicide as a main component formed on the silicon-containing layer, wherein the silicide layer is formed by forming a titanium layer on the silicon-containing layer, forming a protective layer having compression stress on the titanium layer, and converting titanium layer into silicide by thermal processing; and wherein the protective layer is made from at least one metal selected from tungsten, cobalt, tantalum, and molybdenum.

11. The semiconductor device according to claim 10, wherein the silicon-containing layer is at least one of a gate electrode including polycrystalline silicon formed on the silicon substrate, and an impurity layer formed on the silicon substrate.

12. The semiconductor device according to claim 10, wherein the silicon-containing layer has a width of 0.35 $\mu$m or less, and the silicide layer has a sheet resistance of 5 $\Omega/cm^2$ or less.

* * * * *